3,674,485

METHOD OF MANUFACTURING ELECTRICALLY CONDUCTING METAL LAYERS

Hendrik Jonker, Casper Johannes Gerardus Ferdinand Janssen, and Lambertus Postma, Emmasingel, Eindhoven, Netherlands, assignors to U.S. Philips Corporation, New York, N.Y.

No Drawing. Filed Sept. 18, 1968, Ser. No. 760,711
Claims priority, application Netherlands, Sept. 22, 1967, 6712933
Int. Cl. G03c 5/00
U.S. Cl. 96—35 8 Claims

ABSTRACT OF THE DISCLOSURE

Electrically conductive metal patterns are produced by exposing a homogeneous mixture of a hydrophobic resinous binding agent and a light-sensitive semiconductive oxide such as titanium dioxide to light, treating the exposed areas with a copper solution or a solution of a metal at least as high as copper in the E.M.F. series to form a metal nuclei image, and then intensifying the nuclei image by the use of a stabilized physical developer or by the use of an electroless copper, cobalt or nickel-plating bath.

The invention relates to a method of photochemically metallizing plastics uniformly or in accordance with a pattern and particularly to an additive method of photographically manufacturing electrically conducting metal patterns on an insulating layer of a macromolecular material such as, for example, printed circuits.

An additive method of manufacturing printed circuits is to be understood to mean that type of method with the aid of which the metal pattern is directly built up on the uncoated layer of a macromolecular material. This type is distinguished from the subtractive methods in which the starting point is a layer of macromolecular material coated with a metal layer, the superfluous portion of which is removed by etching after the metal parts belonging to the pattern are provided with a resist.

A photographic material is known, namely a basic coating on which there is provided a light-sensitive coating, formed from a resinous binding agent in which solid, finely dispersed particles of a light-sensitive semiconducting oxide, notably $TiO_2$, are homogeneously distributed, the light-reaction product of said light-sensitive semiconducting oxide being capable of depositing copper and/or metal which is nobler than copper from a solution of the relevant metal salt. According to this known method by treating the light-sensitive coating with a solution of silver nitrate after exposure a latent silver nuclei image is obtained which is then contacted with a solution of a photographic reducing agent after intermediate rinsing so that a comparatively weakly visible image is obtained. The quantity of silver salt available for forming the developed image is absolutely insufficient for forming an electrically conducting image. It is alternatively possible to treat the coating with a solution of silver nitrate prior to exposure and with a solution of a photographic reducing agent after exposure, or it can be developed with a non-stabilized physical silver developing agent. The result of the additional intensification is a gain in sensitivity; the maximum optical density, however, only increases from 0.46 to 0.55 and there is no question of obtaining electrically conducting images. Furthermore metal nuclei images, which were obtained by treatment of the exposed coating with a solution of approximately 2.5% by weight of silver nitrate in methanol or by treatment of the unexposed coating with a solution of 5% by weight of cupric nitrate in water, have been intensified by contact with a non-stabilized copper developer to form images which do not have particularly high optical densities and which do not noticeably improve by continued treatment with the developer. This is probably the result of the comparatively poor stability of the copper developer. It has been found from our own experience that such images do not have electrical conductivity.

It was surprisingly found that it is possible in a particularly simple manner to obtain electrically conducting metal patterns of an excellent quality with the aid of this known material on the basis of a light-sensitive semiconductive oxide, notably $TiO_2$, so that the drawbacks existing for the known methods of manufacturing electrically conducting metal patterns are obviated in a manner which is attractive for practical purposes.

The method according to the invention is characterized in that the known light-sensitive carrier layer is used for the manufacture of non-electrically conducting photographic images, which carrier layer is self-supporting or is provided as a coating on a substrate and consists of an insulating, substantially hydrophobic resinous binding agent, in which or on which solid finely dispersed particles of a light-sensitive semiconducting oxide are homogeneously distributed, the light-reaction product of said light-sensitive semiconducting oxide being capable of depositing copper and/or a metal nobler than copper from a solution of the relevant metal salt. According to one aspect of the invention before or after exposure the layer is treated with a solution of a salt of a metal at least as noble as copper, the concentration of the salt in the solution being adjusted for optimum deposition of the relevant metal nuclei. This metal nuclei is then intensified with the aid of a stabilized physical developer or with the aid of an electroless copper-plating, nickel-plating or cobalt-plating bath after the formation of the nuclei image is completed and the metal salt present in the areas outside the nuclei image is removed, if necessary.

As is known, a stabilized physical developer contains one or more suitable ionic surface-active compounds, and possibly one non-ionic surface-active compound so that the spontaneous decomposition thereof is considerably delayed and it is usable for a considerably longer period. In the known photographic method of manufacturing electrically conducting metal patterns the stabilized physical developer is less suitable on a hydrophobic carrier surface which cannot be impregnated with water because the growth of the nuclei image located on the surface is apparently strongly inhibited by the ionic surface-active compound so that in this method it is necessary to use a short pre-intensification by means of a non-stabilized physical developer. It is, however, surprising that in the method according to the invention this stabilized physical developer is on the contrary eminently usable so that it is possible to benefit from all its advantages.

The simplest embodiment of the method according to the invention is the one in which the coating, which does not yet contain silver ions, is directly treated after exposure with a stabilized physical developer containing a silver salt. The silver nuclei image is then formed primarily. By continued contact this nuclei image grows to an electrically conducting silver pattern. The effectiveness of the nuclei image formation and the rate of growth increases with the concentration of the silver salt in the stabilized developer, which of course cannot be increased to an unlimited extent with a view to the desired stability. Concentrations of up to 0.1 mol/litre or even more are, however, very well possible. It is then completely unnecessary to form the silver nuclei image in a separate processing stage.

It is, however, more economical to intensify the silver nuclei image with the aid of an electroless copper-plating bath. In that case the coating is treated prior to the exposure with a solution containing silver ions in a concentration of at least 0.001% by weight and preferably between 0.01 and 0.1% by weight. In this case, however, if a nuclei image thus obtained is contacted with an electroless copper-plating solution after rinsing in deionized water, then copper is deposited without any distinction between the image regions and the substrate. Carrying the invention into effect it has been found that this non-selective metal deposition is caused by silver salt which is held by the coating in such manner that it cannot be removed by a simple rinsing operation. If, however, prior to intensification with the aid of the electroless copper-plating bath the coating containing the silver nuclei image is treated with a suitable repellent such as an aqueous solution containing multivalent metal cations which do not reduce in this medium, but preferably with the aid of ammonia, then the silver salt present outside the nuclei image is removed and the copper is deposited in a completely selective manner, It should, however, be taken into account that certain complexing means for silver salts, such as thiosulphates and thiourea cause an inhibiting effect on the copper deposition. These compounds are thus unsuitable as repellents.

If even the very small quantity of silver, which is still present in the ultimate patterns for the embodiment described hereinbefore, is to be avoided, then for forming, for example, a gold nuclei image the light-reaction product of the semiconducting oxide can be reacted with a soluble gold compound for which purpose preferably an aurous-compound is chosen. To this end the coating is treated prior to the exposure with a solution containing an aurous-compound. Prior to the intensification with the aid of an electroless copper-plating, nickel-plating or cobalt-plating bath the aurous-compound present on the areas outside the nuclei image must be removed by means of a suitable repellent and preferably by means of an aqueous solution containing multivalent metal cations, such as $Pb^{++}$-ions which do not reduce in this medium.

If instead of the treatment with a gold compound the coating is treated prior to the exposure with a solution containing $Pd^{++}$- or $Pt^{++}$-ions in a concentration which as a function of the used metal compound is not lower than from 0.0005 to 0.005% by weight and not higher than from 0.01 to 0.1% by weight then the formed Pd or Pt nuclei image can selectively be intensified without any preliminary repelling treatment with the aid of an electroless copper-plating, nickel-plating or cobalt-plating bath. This results in a valuable simplification as compared with the above-described embodiments.

The most economical embodiment of the method according to the invention is the one in which the coating is treated prior to the exposure with a solution containing cupric ions in a concentration of at least 0.005% by weight and preferably between 0.05% and 2.5% by weight and in which the formed copper nuclei image is directly intensified with the aid of an electroless copper-plating bath. If desired the copper nuclei image can alternatively be intensified after activation with the aid of an electroless nickel-plating or cobalt-plating bath.

If the concentration of cupric ions in the bath with which ions the coating is treated prior to the exposure is chosen to be higher than 2.5% by weight, then a non-selective deposition on the areas outside the nuclei image has an increasingly hampering effect. In that case one has to resort again to a treatment with a repellent for removal of the cupric compound held in these areas. However, by using such a comparatively high concentration no advantage at all is obtained relative to the quality of the pattern obtained. Thus such a complicated operation can be saved by choosing the concentration of the cupric ions in the pre-treatment bath to be not higher than approximately 2.5% by weight.

According to a special embodiment of this method synthetic materials can uniformly be metallized by a uniform exposure according to the invention after providing a light-sensitive coating and by treating the exposed materials in the manner described hereinbefore with reference to the manufacture of electrically conducting metal patterns.

The basic layer may consist of any desired material, for example, of macromolecular material, laminates thereof, glass, ceramic material, metal foil or sheet. A resinous, adhesive medium is available for each basic layer. In this connection reference is made, for example, to I. Skeist, Handbook of Adhesives, New York, 1962. The choice of the composition of the resin is only limited by the condition that under the prevailing circumstances it must not have troublesome reducing properties itself since otherwise metal deposition outside the desired pattern would take place.

Compositions of resins, particularly those which are used as adhesive media, often comprise in combination a thermosetting resin and a slightly flexible adhesive resin. Examples of thermosetting resins may be those of the type phenol formaldehyde and epoxy resins. Resins of the adhesive type are, for example, polyvinyl acetate, polyvinyl butyral, butadiene-acrylonitrile copolymers or flexible adhesive epoxy resins. These compositions of resins will mostly be used while dissolved in an organic solvent or mixture of solvents. Aqueous resin dispersions, for example, of polyacrylate or polyvinyl acetate may alternatively be used.

Reference may be made to $TiO_2$ and ZnO as light-sensitive compounds which are specially suitable for use in the method according to the invention. The light-sensitive compound is dispersed in the resinous solution or suspension in the solid finely dispersed state, for example, with the aid of a ball mill.

The weight ratio of the resin relative to the light-sensitive compound can be varied within ample limits, for example, between 99:1 and 10:90. Preferably a ratio of between 80:20 and 20:80 is used.

The pigmented resinous solution or suspension can be provided on the basic layer with the aid of one of the known methods, such as by pouring, spraying, covering by means of a roller or by drawing from the resinous liquid. It is sometimes recommended to provide first a thin layer of non-pigmented resinous liquid and the actual light-sensitive coating on top of it. The finely dispersed light-sensitive compound may alternatively be provided on the pigmented or non-pigmented resin layer, which is still tacky, with the aid of an atomiser.

It will be evident that already known mechanical, chemical and/or thermal post- or pre-treatments of the resin layer, notably those which are used to obtain an improved adhesion of the pattern of the resin layer, may alternatively be used within the scope of the present invention.

In the above-described prior art additive methods for photographically manufacturing electrically conducting metal patterns on a hydrophobic insulating carrier surface, one is bound to the use of a solution containing mercurous and/or silver ions for forming the metal nuclei image. There are objections of a hygienic nature to the mercury because it is volatile and because mercury compounds are poisonous, while silver is preferably avoided in electronic uses because silver easily migrates and subsequently causes undesired electrical effects.

In the method according to the invention one has the possibility of forming metal nuclei images consisting of copper, gold, platinum or palladium for which the above-mentioned objections do not apply, thus resulting in a wider field of possibilities of application relative to what has been known until now.

With the method according to the invention a good adhesion of the metal pattern on the insulating coating can more easily be obtained than with the above-described known method because the light-sensitive substance is generally not present on top of the resinous layer but within it.

In the method according to the invention the photographic sensitivity is generally considerably greater than with the known methods already described above.

In order that the invention may be readily carried into effect, it will now be described in detail, by way of example with reference to the following embodiments.

EXAMPLE 1

A film of polyethylene terephthalate having a thickness of 75 microns was provided with a light-sensitive adhesive coating of 10 microns thick by pouring a homogeneous dispersion of $TiO_2$ in a solution of polyester resin. Said homogeneous dispersion was obtained by distributing solid finely dispersed particles of the $TiO_2$ in a ratio of 1 g. of light-sensitive substance in 5 gs. of glue solution, for example, with the aid of a ball mill through a 10% solution of a polyester resin prepared from terephthalic acid and propyleneglycol in 1,1,2-trichlorethane, to which 1 gram of a hardener consisting of diphenylmethanedi-isocyanate was added in 40 gs. of the solution of the adhesive. After 24 hours of drying at room temperature exposure took place behind the negative of a wiring pattern with the aid of a high-pressure mercury lamp of 125 watt (type HPR) for 5 seconds at a distance of 60 cms. Subsequently nucleation and physical development took place by treating the film for 4 minutes with a stabilized physical silver developer, containing per litre:

0.08 mol ferric nitrate
0.2 mol ferrous ammonium sulphate
0.1 mol citric acid
0.01% "Armac 12D"
0.01% "Lissapol N"
0.05 to 0.1 mol silver nitrate ("Lissapol N" is a non-ionic surface-active substance consisting of a 27% by weight solution in water of a condensation product of alkyl phenols and ethylene oxide; "Armac 12D" principally consists of dodecylaminoacetate in addition to acetates of amines of lower and higher fatty acids).

The electrically conducting silver pattern obtained therewith was intensified with copper by way of electroplating up to a thickness of 30 microns with the aid of a bath containing 1.5 n $CuSO_4 \cdot 5H_2O$ and 1.5 n $H_2SO_4$ with a current density of 4 amps/sq. dm. at room temperature after rinsing in deionized water and treatment with 1 n sulphuric acid.

A flexible printed circuit pattern having a good adhesion of the pattern of the basic material was obtained.

Similar results can be obtained by using instead of the polyester adhesive a type of adhesive in which each 1 gm. of the sodium salt of o-methoxybenzenediazosulphonic acid is milled together with 3 gms. of a 15% solution in methylethylketone of 2 parts by weight of a butadiene-acrylonitrile copolymer in a molar ratio of 2 butadiene 1,3 and 1 acrylonitrile and 1 part by weight of a cresolformaldehyde-resol having a molar ratio of 1 cresol:1,4 formaldehyde.

It is alternatively possible to obtain satisfactory results by replacing the polyethylene terephthalate film by a polyimide film.

If non-flexible printed circuits are to be manufactured then the mentioned prescription can be used on carriers of hard paper or epoxy glass (glass fibre embedded in epoxy resin).

EXAMPLE 2

A film of polyethylene terephthalate was provided with a 10-micron thick light-sensitive adhesive layer by pouring the homogeneous dispersion of $TiO_2$ described in Example 1 in a solution of polyester resin. After 24 hours of drying at room temperature the film was kept immersed for 15 seconds in a 0.1% by weight solution of $AgNO_3$ in water. Subsequently the film was dried and exposed for 10 seconds at a distance of 30 cms. from a 125 w. HPR lamp. The conversion of the light-reaction product produced during the exposure into a silver nuclei image was completed by rinsing with deionized water for 10 seconds. The silver salt held by the layer in the unexposed areas was subsequently removed by keeping the film immersed in 4% ammonia for 1 minute. After rinsing with water the silver nuclei image was intensified to an electrically conducting copper image with the aid of a chemical copper-plating solution in water containing per litre:

0.14 mol $CuSO_4.5H_2O$
0.30 mol tetra-Na-salt of ethylene diamine tetracetic acid
0.65 mol sodium hydroxide and
160 mls. 35% of formaldehyde solution The duration of action was approximately 3 minutes at a temperature of 20° C. Finally the resulting electrically conducting metal pattern was intensified with copper by means of electroplating to a thickness of 30 microns in the bath and under the circumstances mentioned in Example 1.

EXAMPLE 3

A hard-paper board was provided with a 10-micron thick light-sensitive adhesive coating by spraying of a homogeneous dispersion of $TiO_2$ in a solution of a thermosetting and a flexible adhesive resin.

Said homogeneous dispersion was obtained by distributing solid finely dispersed particles of $TiO_2$ in a ratio of 1 g. of light-sensitive substance in 20 gs. of a solution of the adhesive through a 2½% by weight solution in methylethylkentone of a combination of:

4 parts by weight of a butylated diphenylolpropane resin, modified with castor oil. This resin is obtained by first reacting 4 parts by weight of phenylolpropane with 7 parts by weight of formaldehyde in an alkaline medium and then reacting the obtained, phenylolpropane resol per 2.5 kg. with 2.5 l. butanol, 1 l. castor oil and 1¾ l. xylene,
4 parts by weight of a butadiene-acrylonitrile copolymer, prepared as above,
1 part by weight of a cresolformaldehyde resol having a molecular ratio of 1 cresol:1.4 formaldehyde.

After drying the board was kept immersed for 15 seconds in a 0.1% by weight solution of $$Au\{(CS)(NH_2)_2\}_2ClO_4$$

in water. Then the board was dried in a vertical position and subsequently exposed behind the negative of a wiring pattern for 40 seconds at a distance of 30 cms. from a 125 watt HPR lamp. The conversion of the light-reaction product produced during the exposure into a gold nuclei image was completed by rinsing for 2 minutes with deionized water. The gold compound held in the unexposed areas of the board was subsequently removed by treating the board for 2 minutes with an aqueous 1 molar lead nitrate solution.

After rinsing with water the gold nuclei image was intensified to an electrically conducting copper image by intensifying it for 10 minutes with the aid of the chemical copper-plating solution of Example 2, after which intensification by way of electroplating took place in the manner as described in Example 1.

EXAMPLE 4

Boards of epoxy glass were provided with a 10-micron thick light-sensitive adhesive coating by spraying on it a homogeneous dispersion of $TiO_2$. Said dispersion was obtained by distributing each 1 gm. of $TiO_2$ in 20 gm. of a 2½% by weight solution in methylethylketone of 2 parts by weight of a bisphenol-A-epoxy-resin having an epoxy-equivalent of 450–500 and 1 part by weight of a butadiene-acrylonitrile copolymer in a molar ratio of 2 butadiene 1,3 and 1 acrylonitrile, to each 1600 parts by weight of said solution 1 part by weight of a polyamine hardener was added. After drying each board was kept immersed for 15 seconds in one of the following solutions:

(A) a 0.002% by weight solution of $PdCl_2$ in water, the pH of which was brought to 1.8 by means of hydrochloric acid.

(B) a 0.005% by weight solution of $Pd(NO_3)_2$ in water, the pH of which was adjusted to pH of 1.8 by means of nitric acid.

(C) a 0.01% by weight solution of $Pd(NH_3)_2(NO_2)_2$ in water.

After the boards had been dried in a vertical position they were successively exposed behind the negative of wiring pattern for 10 seconds at a distance of 60 cms. from a 125 watt HPR lamp.

The conversion of the light-reaction product produced during the exposure into a Pd nuclei image was completed and the palladium salt held by the coating on the unexposed areas was removed by rinsing with deionized water for 30 seconds. The nuclei image formed was subsequently intensified to an electrically conducting copper image by treating it for 10 minutes with a chemical copper-plating solution in water containing per litre:

0.026 mol copper sulphate ($CuSO_4.5H_2O$)
0.028 mol tetra-Na-salt of ethylene diamine tetracetic acid
0.1 mol NaOH
20 mls. 35% of formaldehyde solution.

Finally the electrically conducting metal pattern obtained was intensified by way of electroplating to the desired thickness in the bath mentioned in Example 1.

A similar result was obtained with the aid of the light-sensitive resin of Example 3, in which, however, finely dispersed ZnO instead of $TiO_2$ was dispersed in the same quantity.

EXAMPLE 5

A glass plate was provided with a light-sensitive glue coating by pouring a homogeneous dispersion of $TiO_2$ in a solution of a substantially hydrophobic adhesive on the basis of polyvinyl acetate/polyvinyl alcohol. Said homogeneous dispersion was prepared by distributing solid finely dispersed particles of $TiO_2$ in a ratio of 1 g. of light-sensitive substance in 5 gs. of adhesive solution through an adhesive solution which was obtained by diluting a vinylacetate-vinylalcohol copolymer in a 1 to 1 ratio.

After drying at room temperature the glass plate was kept immersed for 15 seconds in a 0.01% by weight solution of $K_2PtCl_4$ in water. Subsequently the plate was dried and exposed for 20 seconds behind a template at a distance of 30 cms. from a 125 w. HPR lamp.

The conversion of the light-reaction product produced during the exposure into a Pt nuclei image was completed and the platinum salt held by the coating on the unexposed areas was removed by rinsing for 20 seconds in deionized water after which the intensification to conducting copper image took place with the aid of the chemical copper-plating solution as mentioned in Example 2. Finally the conducting copper pattern was intensified by way of electroplating. If desired the metal pattern can readily be detached from the glass plate by immersion in alcohol or acetone.

EXAMPLE 6

A hard-paper board was provided with a 10-micron thick light-sensitive adhesive coating by pouring the homogeneous dispersion of $TiO_2$ described in Example 1 in a solution of polyester resin.

After drying the board was kept immersed for 15 seconds in a 0.01% by weight solution of Pd (II) diamine nitrite in water. Subsequently drying, exposure and completion of the nuclei image introduction took place in the manner as described in Example 4 after which the nuclei image formed was intensified to an electrically conducting metal pattern by electroless metallizing for a few minutes in baths having the following compositions:

(A)

30 gms. nickel chloride ($NiCl_2 \cdot 6H_2O$)
10 gms. sodium hypophosphite ($NaH_2PO_2 \cdot H_2O$)
10.5 gms. citric acid and
5.6 gms. sodium hydroxide.
Solvent: water to 1 litre; pH—4.6

(B)

30 gms. cobaltous chloride ($CoCl_2 \cdot 6H_2O$)
10 gms. sodium hypophosphite
20 gms. citric acid
10 gms. sodium citrate
Solvent: water to 1 litre; pH adjusted with the aid of ammonia to 9 to 10.

Finally the conducting metal patterns obtained were intensified to the desired thickness by way of electroplating with copper.

EXAMPLE 7

Epoxy-glass boards were provided with a 10-micron thick light-sensitive adhesive coating by pouring the homogeneous dispersion of $TiO_2$ described in Example 1 in a solution of polyester resin. After drying each panel was kept immersed for 15 seconds in one of the following solutions:

(A) a 0.01% by weight solution of $CuSO_4$ in water.
(B) a 0.05% by weight solution of cupric acetate in water.
(C) a 0.1% by weight solution of cupric formate in water.
(D) a 0.5% by weight solution of $Cu(NO_3)_2$ in water.

After the boards had been dried in a vertical position they were successively exposed behind the negative of a wiring pattern for 20 seconds at a distance of 30 cms. from a 125 w. HPR lamp.

Subsequently the nuclei formation was completed and intensified to an electrically conductive copper pattern by treating the boards for 10 minutes with the chemical copper-plating solution described in Example 2. Finally the electrically conducting copper patterns obtained were intensified to the desired thickness by way of electroplating with copper in the bath described in Example 1.

If it should be desired to use electroless metallizing baths other than a copper-plating solution for the intensification to a conductive metal pattern, the copper nuclei image is to be activated by treating it for 15 seconds with a 0.1 molar solution of hydrochloric acid in water which in addition contains 0.2 g. of $PdCl_2$ per litre. After the nuclei images thus treated are thoroughly rinsed in deionized water for 30 seconds they can be intensified by electroless plating to form conducting nickel or cobalt images with the aid of the solutions mentioned in Example 6.

What is claimed is:

1. A method of photographically manufacturing an electrically conductive pattern on an electrically nonconductive synthetic resin medium, said electrically conductive pattern comprising at least one metal selected from the group consisting of copper, nickel and cobalt, said method comprising, forming a light sensitive medium by mixing an electrically non-conductive, substantially hydrophobic synthetic resin composition and finely divided particles of a light-sensitive semiconductive metal oxide selected from the group consisting of $TiO_2$ and ZnO, treating said resultant light sensitive medium with an aqueous solution of a salt of a metal selected from the group consisting of silver, gold, platinum and palladium, exposing said treated medium to the action of light in a desired pattern, thereby forming a metal nuclei image on the exposed portions of said medium, chemically removing any unexposed and unreduced metal salt present on unexposed portions of said medium and then intensifying the resultant metal nuclei image by treating said medium with an electroless plating bath containing a metal selected from the group consisting of copper, nickel and cobalt.

2. The method of claim 1 wherein the light sensitive medium is uniformly exposed to the action of light.

3. The method of claim 1 wherein the light sensitive medium is treated prior to exposure to light with a solution containing silver ions in a concentration of about 0.01 to 0.1% by weight, the silver nuclei image formed after exposure is intensified by treatment with an electroless copper-plating bath and the medium is treated prior to intensification with ammonia solution to remove silver salt from areas outside of the metal nuclei image.

4. The method of claim 1 wherein prior to exposure the light-sensitive medium is treated with a gold salt in the form of an aurous salt and after exposure the medium is treated with an aqueous solution containing multivalent metal cations nonreducible by the medium to thereby remove any aurous salt present in areas outside of the metal nuclei image.

5. The method of claim 1 wherein prior to exposure to light the light-sensitive medium is treated with a solution containing cupric ions in a concentration of about 0.5 to 2.5% by weight.

6. The method of claim 1 wherein light-sensitive medium is applied to a solid non-light sensitive base.

7. The method of claim 1 wherein the weight ratio of the semiconductive metal oxide to the synthetic resin is from 99:1 to 10:90.

8. A method of photographically manufacturing an electrically conductive silver metal pattern on an electrically non-conductive synthetic resin medium, said method consisting essentially of the steps, forming a light-sensitive medium by mixing an electrically non-conductive, substantially hydrophobic synthetic resin composition and finely divided particles of a light sensitive semi-conductive metal oxide selected from the group consisting of $TiO_2$ and ZnO, exposing said resultant light sensitive medium to the action of light in a desired pattern and then treating said exposed medium with a stabilized silver physical developer containing in an aqueous solution a silver salt, a reducing agent for the silver salt and at least one ionic surface-active compound for a time at least sufficiently long to form an electrically-conductive silver pattern in the light-exposed areas of said medium.

References Cited

UNITED STATES PATENTS

| | | | |
|---|---|---|---|
| 3,223,525 | 12/1965 | Jonker et al. | 96—35 |
| 3,052,541 | 9/1962 | Levinos | 96—27 |
| 3,380,823 | 4/1968 | Gold | 96—27 |
| 3,382,068 | 5/1968 | Gold | 96—48 |

FOREIGN PATENTS

| | | | |
|---|---|---|---|
| 1,092,607 | 11/1967 | Great Britain | 96—48 PD |
| 6,403,056 | 9/1965 | Netherlands. | |

NORMAN G. TORCHIN, Primary Examiner

J. WINKELMAN, Assistant Examiner

U.S. Cl. X.R.

96—36.2, 48 PD, 38.4